United States Patent [19]
Ogawa et al.

[11] Patent Number: 5,975,834
[45] Date of Patent: Nov. 2, 1999

[54] TWO-ARMED TRANSFER ROBOT

[75] Inventors: Hironori Ogawa, Osaka; Hirokazu Yoda, Ibaraki, both of Japan

[73] Assignee: Daihen Corporation, Osaka, Japan

[21] Appl. No.: 09/031,520

[22] Filed: Feb. 27, 1998

[30] Foreign Application Priority Data

Jul. 16, 1997 [JP] Japan .................................. 9-208636

[51] Int. Cl.⁶ .................................................. B25J 18/00
[52] U.S. Cl. ........................................ 414/744.5; 414/941
[58] Field of Search ............................ 414/744.5, 749, 414/941, 936; 74/471 R, 477

[56] References Cited

U.S. PATENT DOCUMENTS

| | | | |
|---|---|---|---|
| 5,151,008 | 9/1992 | Ishida et al. | 414/744.5 |
| 5,333,986 | 8/1994 | Mizukami et al. | |
| 5,421,695 | 6/1995 | Kimura . | |
| 5,439,547 | 8/1995 | Kumagai . | |
| 5,584,647 | 12/1996 | Uehara et al. | 414/744.5 |
| 5,636,963 | 6/1997 | Haraguchi et al. | |
| 5,647,724 | 7/1997 | Davis, Jr. et al. | |
| 5,667,354 | 9/1997 | Nakazawa | 414/744.5 |
| 5,713,717 | 2/1998 | Cho | 414/744.5 |
| 5,765,444 | 6/1998 | Bacchi et al. | 414/744.5 |
| 5,813,823 | 9/1998 | Hofmeister . | |

FOREIGN PATENT DOCUMENTS 7-142552  6/1995  Japan .
8-71965   3/1996  Japan .

*Primary Examiner*—William E. Terrell
*Assistant Examiner*—Gregory A Morse
*Attorney, Agent, or Firm*—Merchant, Gould, Smith, Edell, Welter & Schmidt, P.A.

[57] ABSTRACT

A two-armed transfer robot includes first and second arm mechanisms each having a handling member for carrying a workpiece.

First to third shafts associated with the arm mechanisms are coaxially supported by a stationary base frame for rotation about a first axis. The first arm mechanism has a pantograph assembly including a first arm, an outer link, a pair of intermediate links and an inner link. The first arm carries the outer link for rotation about a second axis. The outer link carries each intermediate link for rotation about a third axis. The third axes are spaced outward from the second axis. The second axis is located between the third axes as viewed circumferentially about the first axis. The first arm mechanism also has rotation-transmitting members and connecting members. The second arm mechanism is substantially identical to the first arm mechanism. The first and the second handling members are vertically spaced from each other to avoid interference with each other.

5 Claims, 16 Drawing Sheets

TWO-ARMED TRANSFER ROBOT

BACKGROUND OF THE INVENTION

1. Field of the Invention

The present invention relates to a two-armed transfer robot useful for semi-conductor manufacturing equipment, liquid crystal display processing equipment and the like. More particularly, the present invention relates to a two-armed transfer robot for transferring workpieces between processing chambers under a vacuum

2. Description of the Related Art

In general, transfer robots are used for semi-conductor manufacturing equipment, liquid crystal display processing equipment and the like. The robot has at least one arm mechanism provided with a handling member. An object to be processed or workpiece such as a silicon wafer is placed on the handling member. The arm mechanism is capable of moving horizontally in a straight line as well as rotating in a horizontal plane. A plurality of processing chambers for performing various kinds of processing are arranged around a rotation axis of the robot. With the use of the transfer robot, the workpiece is suitably brought to and taken away from a selected one of the processing chambers.

For improving efficiency in the transferring operation, use has been made of the so-called two-armed transfer robot having two arm mechanisms. Each arm mechanism has a free end at which a handling member is mounted.

A conventional two-armed transfer robot is disclosed in Japanese Patent Application Laid-open No. 7(1995)-142552 for example.

Referring to FIGS. 14–17 of the accompanying drawings, the prior art robot includes a stationary base frame 80, an inner frame 81 and a first arm 82. The inner frame is rotatable about a vertical axis $O_1$ relative to the base frame 80, while the first arm is rotatable about a first axis $P_1$ extending in parallel to the axis $O_1$. The rotation of the inner frame 81 is actuated by a driving device fixed to the base frame, while the rotation of the first arm 82 is actuated by a driving device fixed to the inner frame 81.

Reference numeral 83 indicates a second arm which is rotatable relative to the first arm 82 about a second axis $Q_1$ extending in parallel to the first axis $P_1$, while reference numeral 84A indicates a handling member which is rotatable relative to the arm 83 about a third axis $R_1$ extending in parallel to the second axis $Q_1$. Reference numeral 85 indicates a first rotation-transmittng member which is fixed to the inner frame 81 coaxially with the first axis $P_1$, while reference numeral 86 indicates a second rolation-transmitting member which is fixed to the second arm 83 coaxially with the second axis $Q_1$. Reference numeral 87 indicates a third rotation-transmitting member fixed to the first arm 82 coaxially with the second axis $Q_1$, while reference numeral 88 indicates a fourth rotation-transmitting member fixed to the handling member 84 coaxially with the third axis $R_1$.

A first connecting member 89 is provided between the first rotation-transmitting member 85 and the second rotation-transmitting member 86, while a second connecting member 90 is provided between the third rotation-transmitting member 87 and the fourth rotation-transmitting member 88. The distance S between the first and second axes is equal to the distance between the third and fourth axes. The radius ratio of the first rotation-transmitting member 85 to the second rotation-transmitting member 86 is 2 to 1. The radius ratio of the fourth rotation-transmitting member 88 to the third rotation-transmitting member 87 is also 2 to 1.

Chain sprockets or pulleys may be used for the first to fourth rotation-transmitting members 85–88. Correspondingly, the first and second connecting members 89, 90 may be chains or timing belts.

The first arm mechanism 91 is made up of the above-mentioned elements 82–90. A second arm mechanism 92, which is symmetrical to the first arm mechanism with respect to the X—X line, is supported for rotation about the second axis $P_2$ extending in parallel to the axis $O_1$.

Thus, the distance between the axis $O_1$ and the first axis $P_1$ is equal to that between the axis $O_1$ and the second axis $P_2$. The two-armed transfer robot is made up of the above elements 80–92.

The operations of the first and the second arm mechanisms 91, 92 are symmetrical with respect to the X—X line and substantially the same. Therefore, description will be made to the operation of the first arm mechanism 91.

First, it is assumed that the inner frame 81 is kept stationary to the fixed base frame 80, and that the first, second and third axes $P_1$, $Q_1$, $R_1$ are initially located on a common straight line, as shown in FIG. 16. Starting from this state, the first arm 82 is rotated counterclockwise through an angle θ about the first axis $P_1$.

During the above operation, the first rotation-transmitting member 85 is stationary, while the second axis $Q_1$ is rotated counterclockwise through the angle θ to be brought to the $Q_{11}$ position. As a result, a $Y_1$-side portion of the first connecting member 89 is wound around the first rotation-transmitting member 85, whereas a $Y_2$-side portion is unwound from the first rotation-transmitting member 85.

Thus, the first connecting member 89 is shifted in a direction shown by arrows $a_1$ and $a_2$. As a result, the second rotation-transmitting member 86 is rotated clockwise about the second axis $Q_1$.

As previously mentioned, the radius ratio of the first rotation-transmitting member 85 to the second rotation-transmitting member 86 is 2 to 1. Thus, when the first arm 82 is rotated counterclockwise about the first axis $P_1$ through the angle θ, the second rotation-transmitting member 86 is rotated clockwise about the second axis $Q_{11}$ through an angle 2θ.

At this time, since the second rotation-transmitting member 86 is fixed to the second arm 83, the second rotation-transmitting member 86 and the second arm 83 are rotated clockwise about the second axis $Q_1$ through an angle 2θ.

If the second arm 83 is not moved relative to the first arm 82, the third axis is brought to the $R_{11}$ position shown by broken lines when the first arm 82 is rotated counterclockwise about the first axis $P_1$ through an angle θ, starting from the initial state where the first, the second and the third axes $P_1$, $Q_1$, $R_1$ are positioned on the same line. Actually, however, the second rotation-transmitting member 86 is rotated clockwise about the second axis $Q_{11}$ through an angle 2θ. Therefore, the third axis $R_{11}$ is rotated clockwise about the second axis $Q_{11}$ through the angle 2θ, and brought to the $R_{12}$ position.

As a result, after the first arm 82 is rotated counterclockwise about the first axis $P_1$ through an angle θ, the third axis $R_{12}$ is still on the straight line extending through the first and the third axis $P_1$ and $R_1$.

Further, when the second arm 83 is rotated clockwise about the second axis $Q_{11}$ through an angle 2θ so that the third axis is brought to the $R_{12}$ position, a $Y_2$-side portion of the second connecting member 90 is wound around the third rotation-transmitting member 87, whereas a $Y_1$-side portion is unwound from the third rotation-transmitting member 87.

As a result, the second connecting member 90 is shifted in a direction $b_1$–$b_2$ shown in FIG. 16. Thus, the fourth rotation-transmitting member 88 is rotated counterclockwise about the third axis $R_{12}$.

When the second arm 83 is rotated clockwise about the second axis $Q_{11}$ through an angle $2\theta$ as described above, the fourth rotation-transmitting member 88 is rotated counterclockwise about the third axis $R_{12}$ through an angle $\theta$ since the radius ratio of the fourth rotation-transmitting member 88 to the third rotation-transmitting member 87 is 2 to 1. As a result, a point $C_0$ of the fourth rotation-transmitting member 88 is brought to a point $C_1$ on the straight line passing through the first and the third axes $P_1$, $R_{12}$.

Upon rotation of the first arm 82 about the first axis $P_1$ in the counterclockwise direction as described above, the first arm mechanism 91 is actuated in the X-direction. Accordingly, the handling member 84A is moved along the line passing through the first and the third axes $P_1$, $R_1$. During this movement, however, the handling member 84A does not changed its attitude or orientation since it is fixed to the fourth rotation-transmitting member 88.

Likewise, the second arm mechanism 92 is actuated in the X-direction, while the second handling member 84B keeping its initial attitude along the line passing through the first and the third axes $P_2$, $R_2$.

The first and the second handling members 84A, 84B are arranged between the axes $P_1$, $P_2$ as viewed in the $Y_1$–$Y_2$ direction. Further, the extremities of the handling members 84A, 84B are vertically spaced from each other. Thus, upon actuation of the arm mechanisms 91, 92, the handling members 84A, 84B can move along the X—X line passing through the axis $O_1$ without interfering with each other.

When the inner frame 81 is rotated about the axis $O_1$, the first and the second arm mechanisms 91, 92 are simultaneously rotated about the axis $O_1$.

As shown in FIG. 17, a suitable number (six in the figure) of processing chambers are arranged around the axis $O_1$ of the two-armed transfer robot. Workpieces are transferred by the robot to these chambers to be processed.

The prior art transfer robot has been found to have the following disadvantages. First, the fourth rotation-transmitting member 88 and the second connecting member 90 are provided at the extremity of the second arm 83 for maintaining the initial orientation of the handling member 84 along the $P_1$–$R_1$ line. Therefore, the height $H_1$ (see FIG. 15) of the arm mechanism is made unfavorably large. This requires that each processing chamber have a large insertion window to allow the passage of the arm mechanism.

Further, as shown in FIGS. 14–16, the axis $P_1$ of the first arm mechanism 91 and the axis $P_2$ of the second arm mechanism 92 are spaced from each other, with the axis $O_1$ of the inner frame 81 located therebetween. This arrangement renders the rotation radius of the inner frame 81 unfavorably large.

Accordingly, the bearings 93 provided around the inner frame 81 have an unfavorable large diameter, and the magnetic fluid seal 94 for hermetic sealing suffers the same problem. With the use of such bearings and magnetic fluid seal, the overall size of the robot is also increased. Therefore, the price of the robot is rendered unduly high.

Further, the driving devices for linearly moving the handling members 84A, 84B are mounted on the inner frame 81. Thus, the driving devices are rotated together with the inner frame 81. For supplying the driving devices with electricity, use is made of a cable extending from the base frame 80. Thus, the rotation angle or the number of rotation of the inner frame 81 is limited to prevent the cable from breaking.

For realizing the above-mentioned prevention, a suitable monitoring device and a controlling unit are needed to stop the rotation of the inner frame 81 before the rotation angle of the frame exceeds a predetermined threshold value (540° for example). However, such additional devices make the robot expensive. More importantly, the additional devices do not eliminate the limitation to the rotation angle. Thus, the conventional robot is not only expensive but inconvenient to operate.

SUMMARY OF THE INVENTION

It is, therefore, an object of the present invention to provide a compact, inexpensive two-armed transfer robot which is easy to operate and capable of providing good productivity.

According to a first aspect of the present invention, there is provided a two-armed transfer robot having a first arm mechanism and a second arm mechanism. Each arm mechanism has an extremity provided with a handling member for carrying a workpiece to be processed. The handling member is arranged not only to linearly move in a horizontal plane but to rotate in the horizontal plane. The robot also includes a stationary base member and first to third shafts supported by the base member. The first to third shaft are coaxially rotatable about a first axis extending vertically. Actuation of the shafts is realized by first to third driving devices associated with the first to the third shafts, respectively. Each driving device is attached to the base member. The first arm mechanism includes a pantograph assembly made up of a first arm, an outer link, a pair of intermediate links and an inner link. The first arm is connected to the first shaft. The outer link is supported with respect to the first arm for pivotal movement about a second axis extending in parallel to the first axis. Each intermediate link is supported with respect to the outer link for pivotal movement about a third axis. (Thus, there are two third axes in all.) The third axes are spaced outward from the second axis, and the second axis is located between the third axes as viewed circumferentially about the first axis. The inner link is supported with respect to each intermediate link for pivotal movement about a fourth axis located at a free end of said each intermediate link. (Thus, there are two fourth axes in all.) The distance between the third axis and the fourth axis being equal to the distance between the first axis and the second axis. The first arm mechanism further includes a first rotation-transmitting member fixed to the second shaft, a second rotation-transmitting member fixed to the outer link coaxially with the second axis, a third rotation-transmitting member fixed to the first arm coaxially with the second axis, a pair of fourth rotation-transmitting members each fixed to one of the intermediate links coaxially with the third axis, a first connecting member extending between the first and the second rotation-transmitting members, and a second connecting member extending between the third and the fourth rotation-transmitting members. The second arm mechanism is connected to the third shaft and substantially identical in arrangement to the first arm mechanism. The first and the second arm mechanisms are symmetrical to each other with respect to the first axis. The first handling member is carried by the inner link of the first arm mechanism, while the second handling member is carried by the inner link of the second arm mechanism. The first and the second handling members are vertically spaced from each other. The first and the second handling members are arranged not only to linearly move in horizontal straight lines passing through the first axis but to rotate simultaneously around the first axis.

With such an arrangement, it is possible to simplify the mechanism for transmitting the rotational force generated around the first axis $O_1$ to the fourth rotation-transmitting member.

Further, the first to the third shafts are coaxially supported about a common vertical axis. Thus, the bearings and the seals provided around the respective shafts are made small in diameter. As a result, the overall size of the transfer robot is rendered relatively small as compared with the conventional robot.
Accordingly, the price of the robot is reduced.

Further, according to the present invention, the third axes are arranged offset outward from the second axis, with the second axis located between the third axes as viewed circumferentially about the first axis. In addition, the distance between the third axis and the fourth axis is equal to the distance between the first axis and the second axis.

With such an arrangement, the inner links of the respective pantograph assemblies are moved in parallel to a horizontal line passing through the first axis, while maintaining a distance between the inner links.

Further, each pantograph assembly carrying a handling member is made advantageously small in thickness since there is no need to use the conventional rotation-transmitting member and connecting member described above. Thus, the height of the base portions of the respective handling members is reduced. Accordingly, the size of the insertion window of each processing chamber is also reduced.

Further, the first to the third driving devices are attached to the stationary base member. Therefore, unlike the conventional robot, there is no limitation to the rotational angle of the first and the second handling members around the first axis. Thus, the present invention serves to increase productivity.

The intermediate links of the respective pantograph assemblies may be arranged in a common plane.

The inner link of one arm mechanism may be attached to an upper surface of each intermediate link of said one arm mechanism while the inner link of the other arm mechanism may be attached to a lower surface of each intermediate link of said other arm mechanism.

The first arm mechanism may include a third handling member attached to the inner link of the first arm mechanism. The third handling member may be arranged to project opposite to the first handling member. Similarly, the second arm mechanism may include a fourth handling member attached to the inner link of the second arm mechanism. The fourth handling member may be arranged to project opposite to the second handling member.

Each of the first to the third shafts may be rotatably supported via a magnetic fluid seal for hermetic sealing.

Other objects, features and advantages of the present invention will be fully understood from the following detailed description given with reference to the accompanying drawings.

DETAILED DESCRIPTION OF THE PREFERRED EMBODIMENTS

Figure 1A:
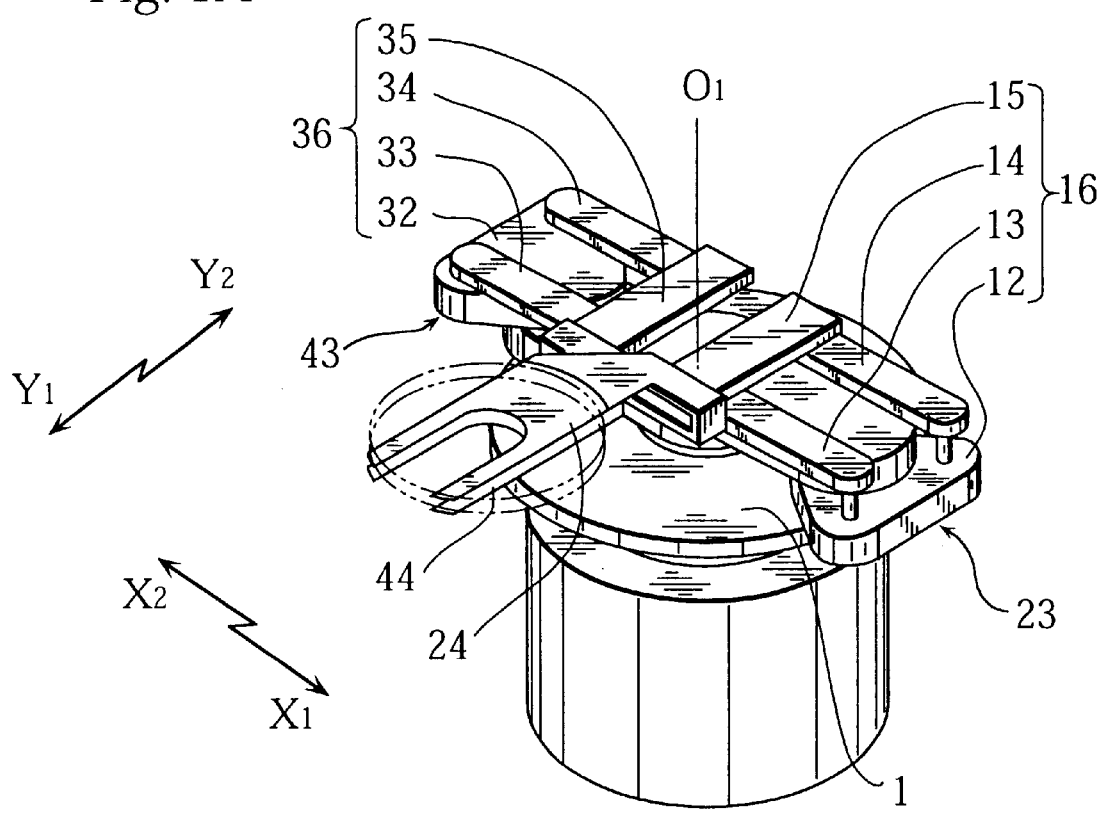
FIG. 1A is a perspective view showing a two-armed transfer robot according to a first embodiment of the present invention, wherein a first and a second handling members are folded.
Figure 1B:
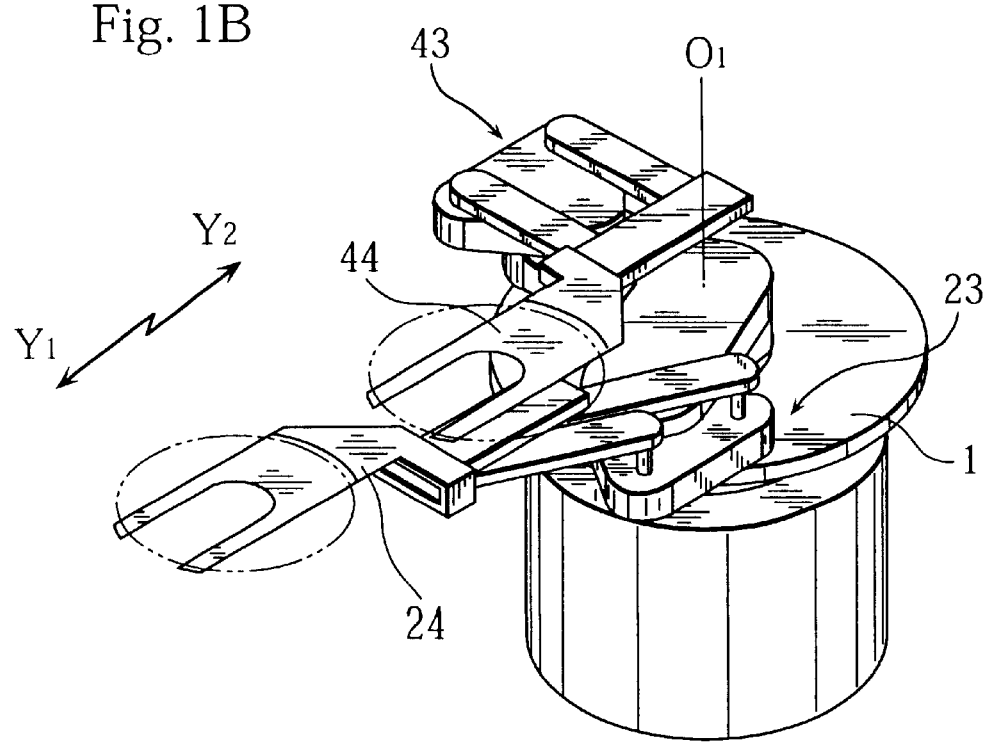
FIG. 1B is a perspective view showing the robot of FIG. 1A, wherein the first handling member is linearly moved in the $Y_1$ direction.
Figure 2:
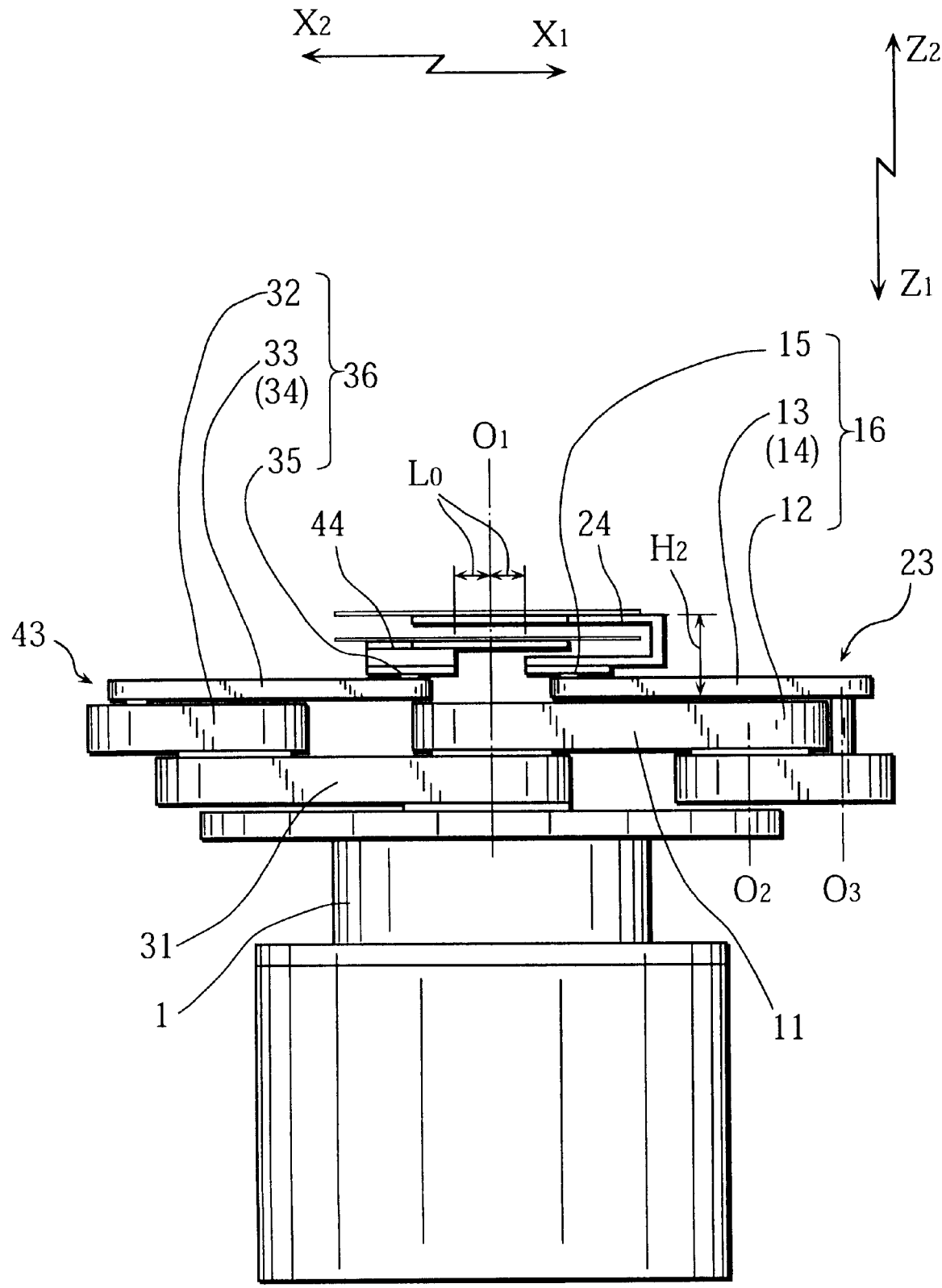
FIG. 2 is a front view showing the same robot.

The present invention will now be described in more specific detail on the basis of embodiments shown in the accompanying drawings.

Referring to FIGS. 1–10, there is illustrated a two-armed transfer robot according to a first embodiment of the present invention. The transfer robot includes a stationary base member 1 and first to third shafts 2–4. The shafts 2–4 are supported by the base member 1 via suitable bearings and coaxially rotated about a first axis $O_1$ extending vertically. The base member 1 may be installed in a vacuum chamber V.C. For maintaining the vacuum condition in the vacuum chamber, magnetic fluid seals 5–7 are provided around the respective shafts 2–4.

The illustrated robot also includes first to third driving device 8–10 for actuation of the respective shafts 2–4. Each driving device is associated with a corresponding shaft via a suitable speed reducer, a rotation-transmitting member such as a sprocket or a pulley for example, and a connecting member such as a chain or a timing belt for example.

The robot further includes a first arm 11, an outer link 12, a pair of intermediate links 13, 14 and an inner link 15. The first arm 11 is connected to the first shaft 2. The outer link 12 is pivotable with respect to the first arm 11 about a second axis $O_2$ extending in parallel to the first axis $O_1$. The intermediate links 13, 14 are pivotable with respect to the outer link 12 about a pair of third axes $O_3$. As viewed from above, the third axes $O_3$ are outwardly offset from the second axis $O_2$, and spaced from each other. Thus, as viewed circumferentially about the first axis $O_1$, the second axis $O_2$ is located between the pair of third axes $O_3$. Each intermediate link has a free end at which a fourth axis $O_4$ extends vertically. The inner link 15 is pivotable about the fourth axes $O_4$ of the respective intermediate links. A pantograph assembly 16 is made up of the inner link 15, the pair of intermediate links 13, 14, and the outer link 12. The distance between the third and the fourth axes $O_3$, $O_4$ is equal to that between the first and the second axes $O_1$, $O_2$.

A first rotation-transmitting member 17 is attached to the second shaft 3, while a second rotation-transmitting member 18 is attached to the outer link 12. The second rotation-transmitting member 18 has a central axis coinciding with the second axis $O_2$. Further, a third rotation-transmitting member 19 is attached to the first arm 11, while fourth rotation-transmitting members 20 are attached to the respective intermediate links 13, 14. The third rotation-transmitting member 19 has a central axis coinciding with the second axis $O_2$, while each of the fourth rotation-transmitting members 20 has a central axis coinciding with one of the third axes $O_3$. A first connecting member 21 is provided between the first and the second rotation-transmitting members 17, 18, while a second connecting member 22 is provided between the third and the fourth rotation-transmitting members 19 20. The first rotation-transmitting member 17 is equal in diameter to the second rotation-transmitting member 18, while the third rotation-transmitting member 19 is equal in diameter to the fourth rotation-transmitting member 20. A first arm mechanism 23 is made up of the above elements 11–22.

The illustrated robot also has a second arm mechanism 43 connected to the third shaft 4. The second arm mechanism 43, which is made up of elements 31–42, has an arrangement substantially identical to that of the first arm mechanism 23. As shown in FIGS. 1–4, the first and the second arm mechanisms 23, 43 are symmetrical to each other with respective to the first axis $O_1$.

The inner link 15 of the pantograph assembly 16 carries a first handling member 24, while the inner link 35 of the pantograph assembly 36 carries a second handling member 44. The first and the second handling members 24, 44 are vertically spaced from each other. As will be described hereinafter, the first and the second handling members 24, 44 are arranged not only to move horizontally in straight lines passing through the first axis $O_1$ but to rotate or revolve simultaneously around the first axis $O_1$.

The illustrated transfer robot is made up of the elements 1–44 described above. A suitable number of processing chambers are arranged around the first axis $O_1$ in a known manner.

Figure 3:
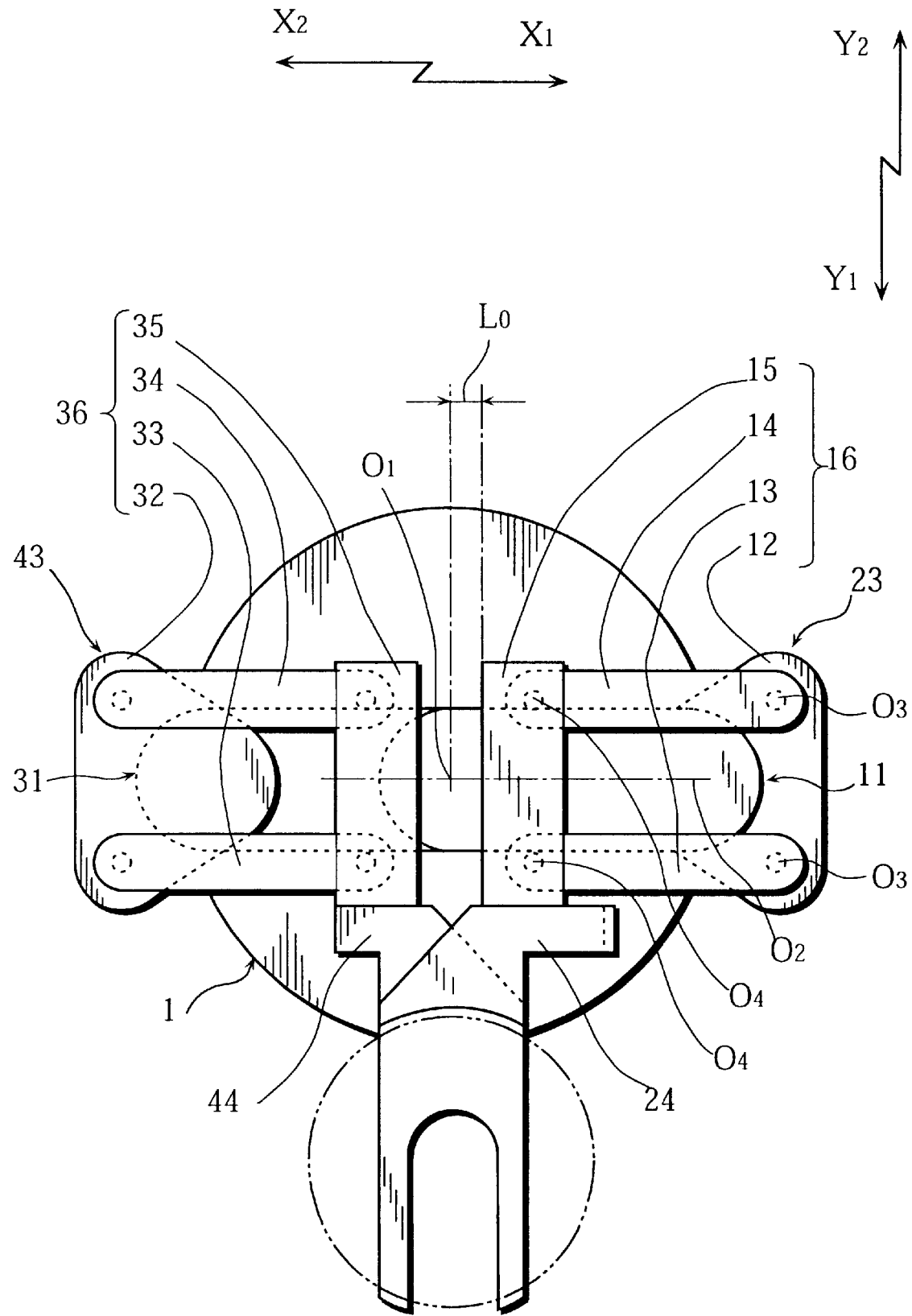
FIG. 3 is a plan view showing the same robot.
Figure 4:
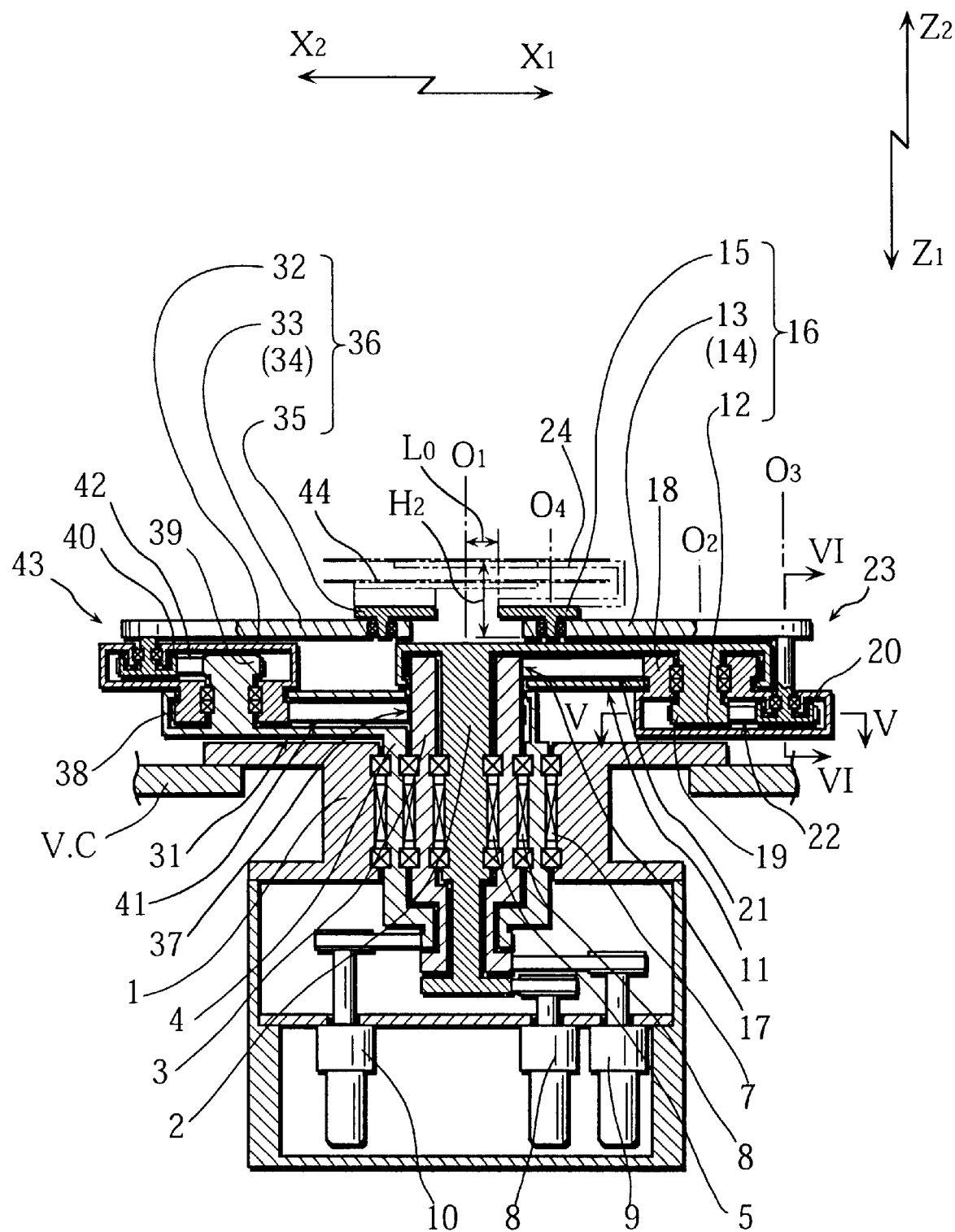
FIG. 4 is a sectional front view showing the same robot.
Figure 5:
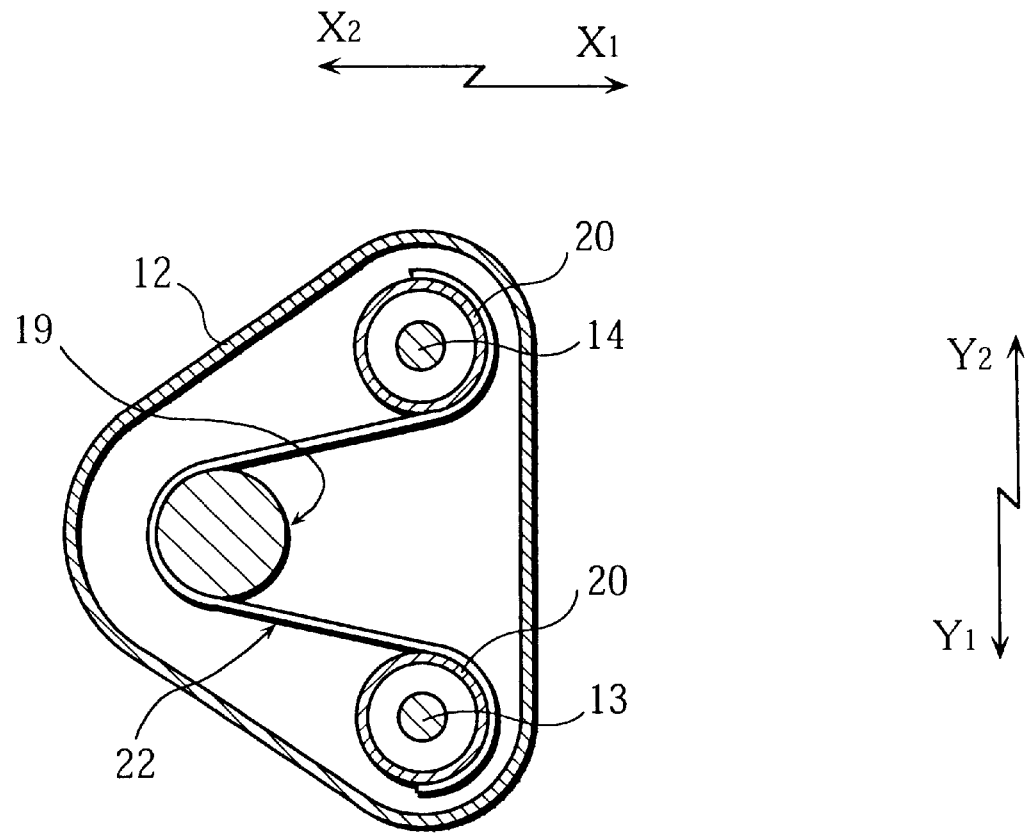
FIG. 5 is a sectional view taken along lines V—V in FIG. 4.
Figure 6:
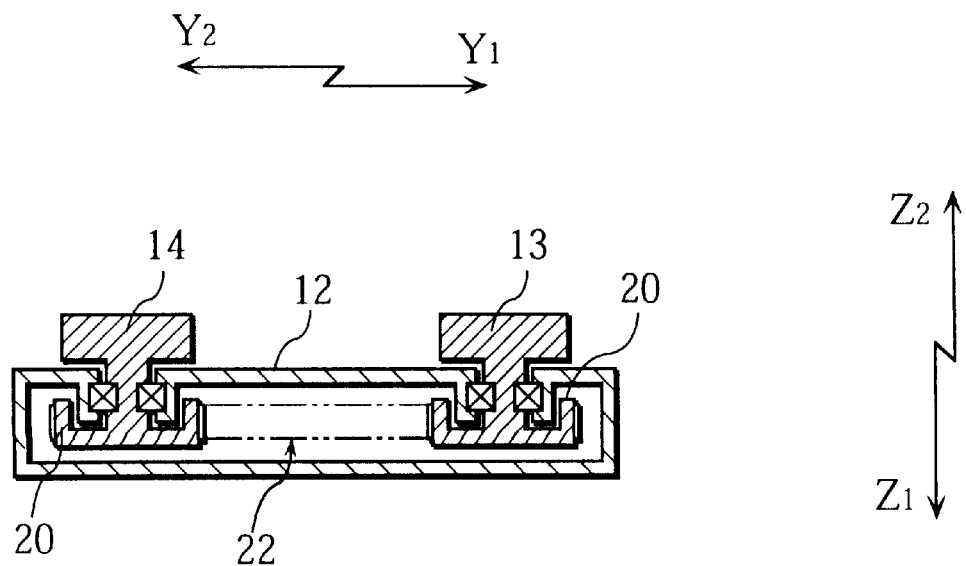
FIG. 6 is a sectional view taken along lines VI—VI in FIG. 4.
Figure 7:
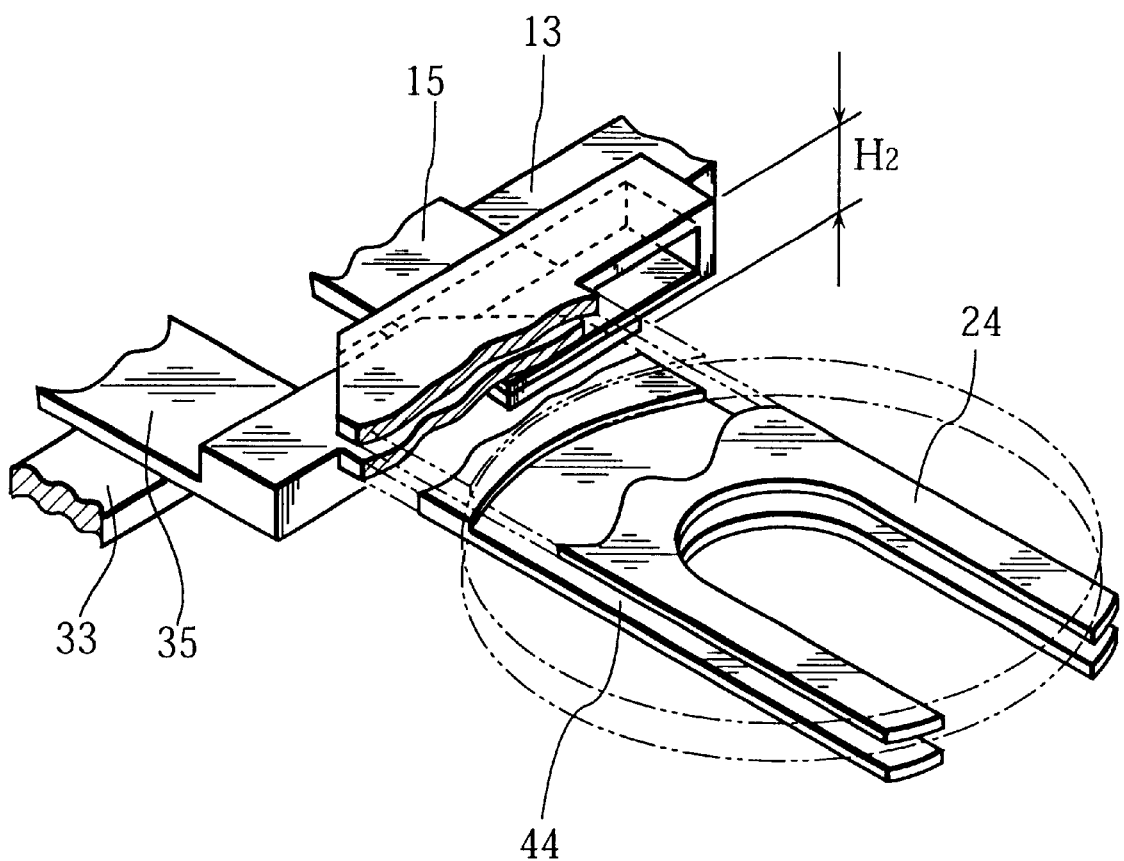
FIG. 7 is an enlarged perspective view showing the handling members of the same robot.
Figure 8A:
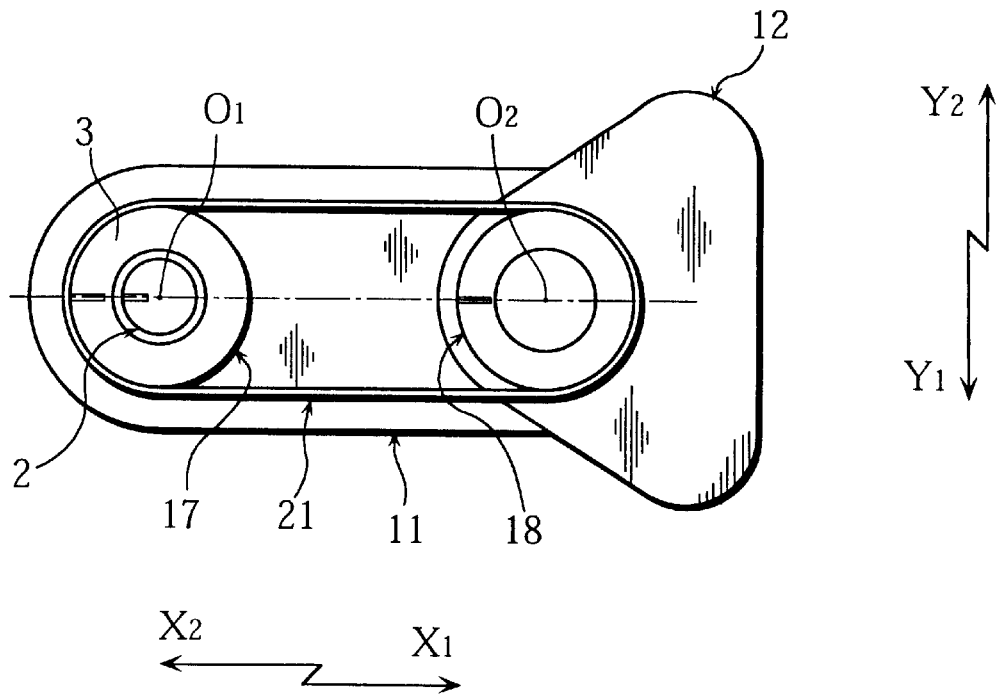
FIGS. 8A–8B are plan views illustrating the operation of principal elements.
Figure 8B:
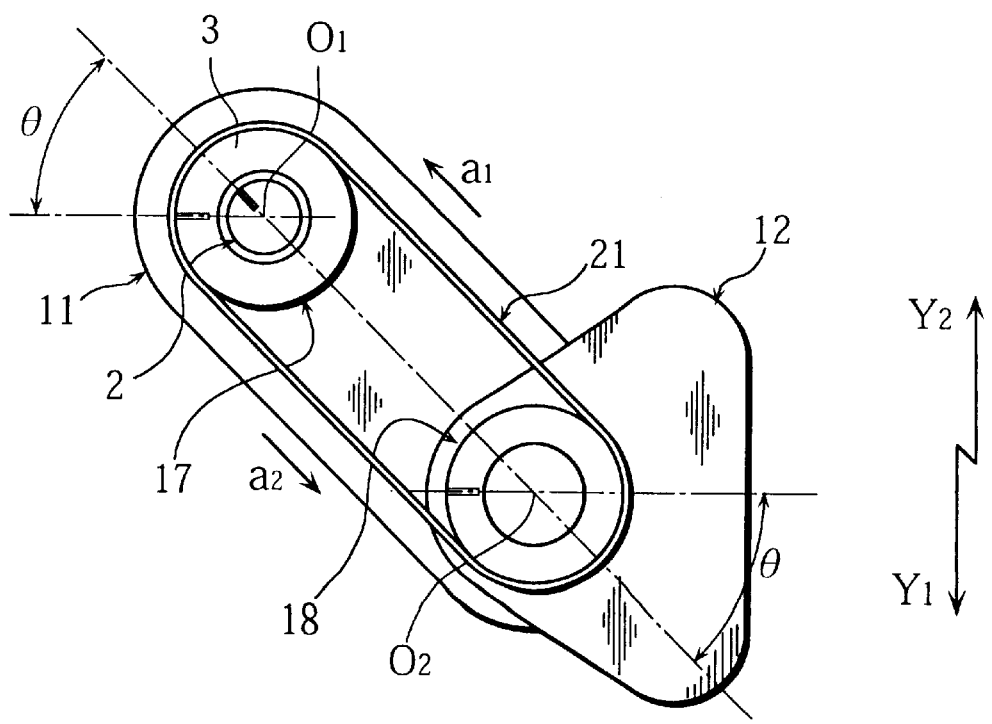

Description will be now made to the operation of the first arm mechanism 23. It is assumed that the straight line passing through the first and the second axes $O_1$, $O_2$ initially extends in the X-direction, as shown in FIG. 3.

Upon actuation of the first driving device 8, the first shaft 2 is rotated, clockwise for example, about the first axis $O_1$ through an angle $\theta$. Then, the first arm 11 is rotated clockwise about the first axis $O_1$ through an angle $\theta$ from the position shown in FIG. 8A to the position shown in FIG. 8B. At this time, however, the second driving device 9 associated with the second shaft 3 is not actuated. Thus, the first rotation-transmitting member 17, which is attached to the second shaft 3, is not rotated.

When the first arm 11 is moved in the above-described manner, a $Y_1$-side portion of the first connecting member 21 is unwound from the first rotation--transmitting member 17, whereas a $Y_2$-side portion of the first connecting member 21 is wound around the first rotation-transmitting member 17. Thus, the first connecting member 21 is moved in a direction shown by arrows $a_1$ and $a_2$ (see FIG. 8B). Therefore, the second rotation-transmitting member 18 is rotated counter-clockwise about the second axis $O_2$ through an angle $\theta$. Thus, the outer link 12, which is fixed to the second rotation-transmitting member 18, is also rotated counter-clockwise through an angle $\theta$. It follows that the outer link 12 maintains its orientation as being moved around the first axis $O_1$ from the position shown in FIG. 8A to the position shown in FIG. 8B.

Next, description will be made to operation of the third and the fourth rotation-transmitting members 19, 20 and the second connecting member 22.

Figure 9A:
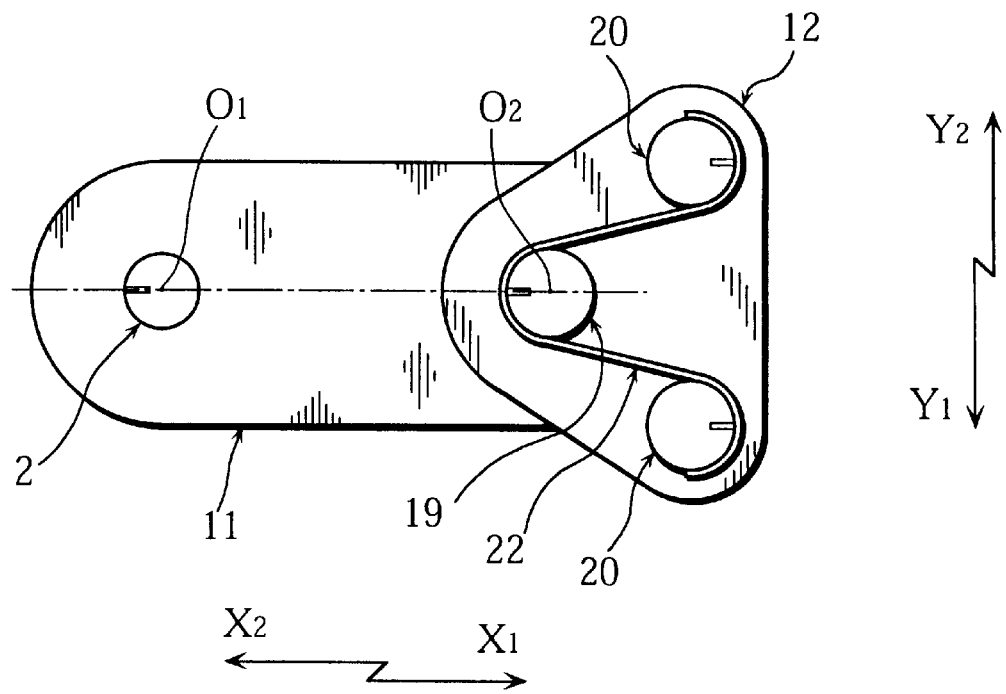
FIGS. 9A–9B are plan views illustrating the operation of the principal elements.
Figure 9B:
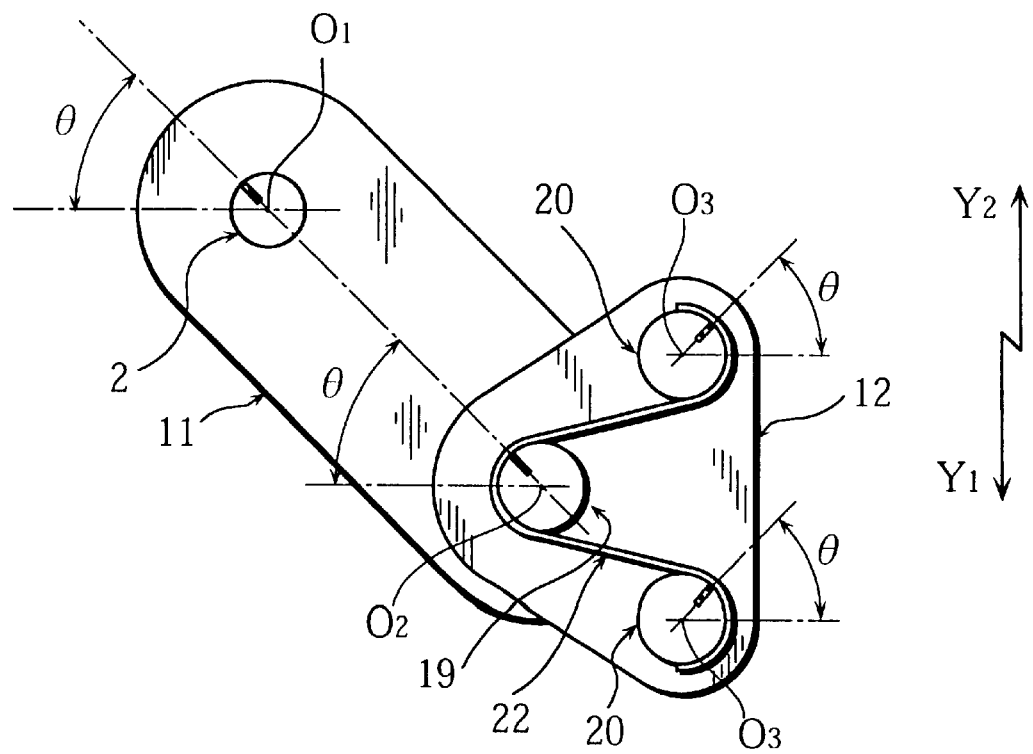

Referring to FIGS. 9A–9B, when the first arm 11 is rotated through an angle $\theta$ as illustrated, the third rotation-transmitting member 19 (which is fixed to the first arm 11) is rotated clockwise about the second axis $O_2$ through an angle $\theta$ with respect to the initial position. Thus, the second connecting member 22 is moved in a direction shown by arrows $b_1$ and $b_2$, while the fourth rotation-transmitting member 20 is rotated counterclockwise about the third axis $O_3$ through an angle $\theta$.

The fourth rotation-transmitting members 20 are fixed to the respective intermediate links 13, 14. Thus, upon rotation of the first arm 11 in the above-described manner, the pantograph assembly 16 is shifted from the position shown in FIG. 10A to the position shown in FIG. 10B.

As previously described, the distance between the third and the fourth axes $O_3$, $O_4$ is equal to that between the first and the second axes $O_1$, $O_2$. Further, the first and the second rotation-transmitting members 17, 18 are equal in diameter, and the third and the fourth rotation-transmitting members 19, 20 are equal in diameter. Thus, upon clockwise rotation of the first arm 11 about the first axis $O_1$ through an angle $\theta$ from the position shown in FIG. 10A to the position shown in FIG. 10B, the intermediate links 13, 14 of the pantograph assembly 16 are caused to pivot counterclockwise about the third axes $O_3$ through an angle $\theta$ with respect to the initial position. At this time, the inner link 15 maintains its initial attitude.

Figure 10A:
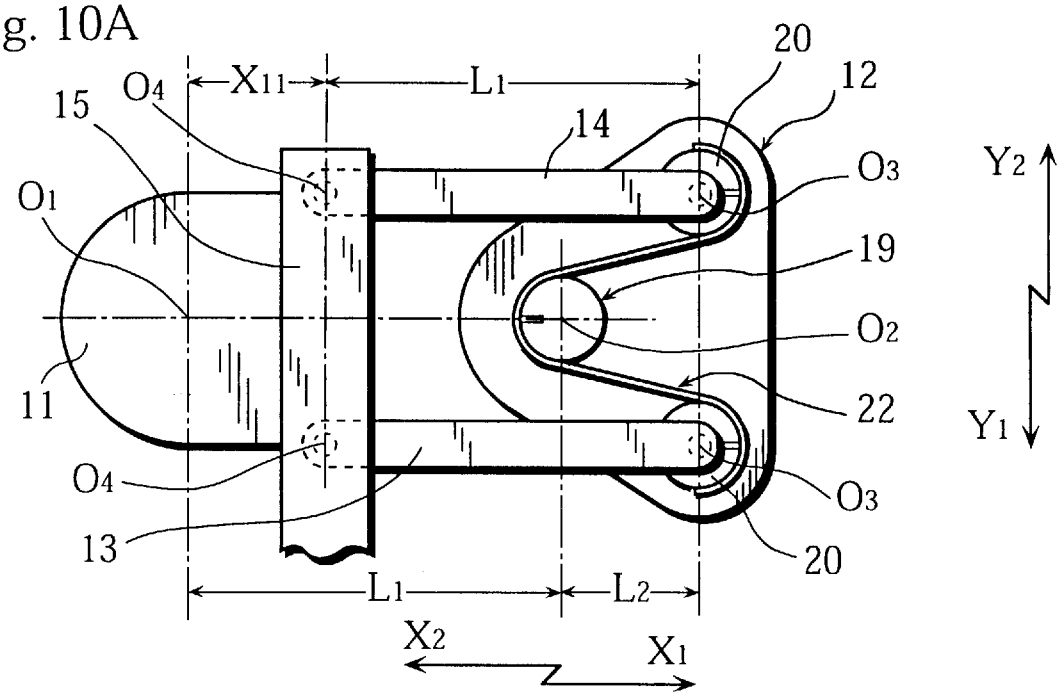
FIGS. 10–10B are plan views illustrating the operation of a pantograph assembly.

Referring to FIG. 10A, the distance as viewed in the X-direction between the first and the second axes $O_1$, $O_2$ is designated by reference $L_1$, while the distance between the third and the fourth axes $O_3$, $O_4$ is also designated by $L_1$. The distance between the second and the third axes $O_2$, $O_3$ is designated by reference $L_2$, while the distance between the fourth and the first axes $O_4$, $O_1$ by reference $X_{11}$. In such an instance, the distance $L_2$ is equal to the distance $X_{11}$.

Figure 10B:
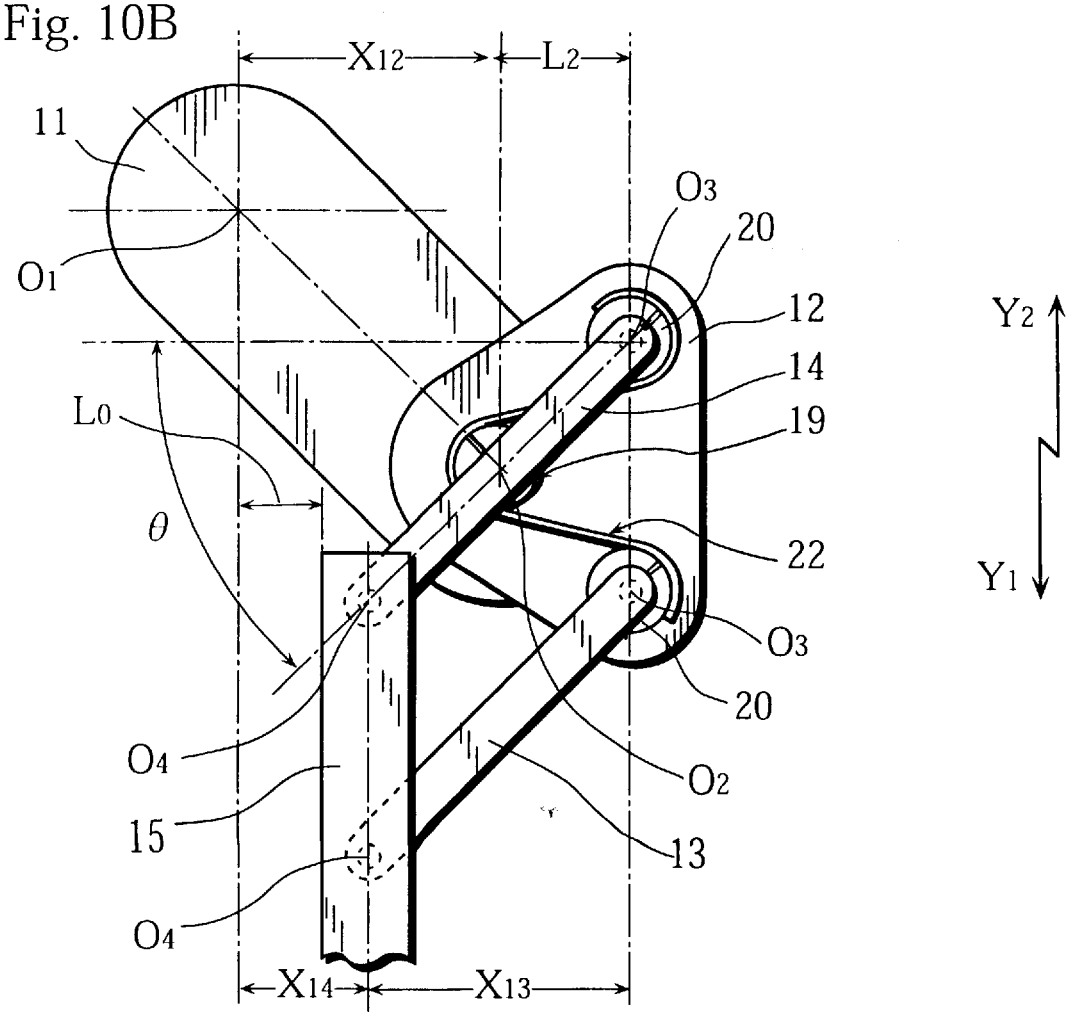

Referring to FIG. 10B, distances $X_{12}$, $X_{13}$ and $X_{14}$ as viewed in the X-direction between the axes are defined as illustrated. Then, the following relations hold:

$X_{12}+L_2=X_{13}+X_{14}$;

$X_{12}=L_1\cos\theta$; and $X_{13}=L_1\cos\theta$.

From these relations, $X_{14}=L_2$ results. Since $X_{11}=X_{14}=L_2$, it can be known that, though the pantograph assembly 16 is caused to deform upon clockwise or counterclockwise rotation of the first arm 11 about the first axis $O_1$, the line connecting two of the fourth axes $O_4$ always lies on the same line. Thus, the inner link 15 of the pantograph assembly 16 is moved in parallel to the horizontal line passing through the first axis $O_1$, while maintaining the distance $L_0$ to the first axis $O_1$.

The first and the second handling members 24, 44 are attached to the respective arm mechanisms 23, 43 in a manner that each handling member has a central axis which coincides (as viewed horizontally) with the above-mentioned horizontal line passing through the first axis $O_1$. As previously described, the first and the second handling members 24, 44 are vertically spaced from each other. Thus, upon horizontal movement, the two handling members do not interfere with each other.

In operation, the first handling member 24 is linearly moved in the $Y_1$-direction to a predetermined position (see FIG. 1B) upon outward movement of the first arm mechanism 23. At the illustrated position, a workpiece is shifted onto or away from the handling member 24.

After the workpiece is shifted, the first arm mechanism 23 is moved inward to bring the first handling member 24 to the position illustrated in FIG. 1A. The position of FIG. 1A will be hereinafter referred to "position of horizontal rotation".

When the first handling member 24 is at the position of horizontal rotation, the second arm mechanism 43 will be operated. Referring to FIG. 3, the second handling member 44 is moved in the $Y_1$-direction upon counterclockwise rotation of the second arm 31 about the first axis $O_1$. The operation of the second arm mechanism 43 is basically the same as that of the first arm mechanism 23.

When the second handling member 44 is moved in the $Y_1$-direction, only the third driving device 4 is being actuated. Then, the second arm mechanism 43 is horizontally shifted outward to a predetermined position. At this position, a workpiece is shifted onto or away from the second handling member 44. Thereafter, the second arm mechanism 43 is moved inward toward the first axis $O_1$ to bring the second handling member 44 to the position of horizontal rotation.

The first and the second handling members 24, 44 are simultaneously rotated around the first axis $O_1$ in the following manner. Specifically, with both handling members held at the position of horizontal rotation, the first to the third driving devices 8–10 are synchronously actuated for rotating the first to the third shafts 2–4 in the same direction and at the same angular speed. As a result, the elements attached to the first to the third shafts 2–4 are moved in the same direction. Thus, the above-mentioned elements as a whole are rotated clockwise or counterclockwise (as viewed in FIG. 3 for example) about the first axis $O_1$, while the handling members 24, 44 are held in the position of horizontal rotation.

After the first and the second handling members 24, 44 are simultaneously rotated through a predetermined angle, selected one of the first and the second handling members 24, 44 is moved outward in a horizontally-extending line passing through the first axis $O_1$. Then, workpieces are shifted onto or away from the handling members 24, 44.

According to the present invention, it is possible to provide a simplified transmission assembly for transmitting power from a driving device to an arm mechanism. Thus, compact transfer robots are obtainable.

Further, since the third axes of the present invention are spaced or offset outward from the second axis, with the second axis located between the two third axes as viewed circumferentially about the first axis. In addition, the distance between the third axis $O_3$ and the fourth axis $O_4$ is equal to that between the first axis $O_1$ and the second axis $O_2$. Thus, upon actuation of the first and the second arm mechanisms 23, 43, the inner links 15, 35 of the respective arm mechanisms are moved in parallel to a horizontal straight line passing through the first axis $O_1$. At this time, the distance between the inner links facing each other remains constant.

Further, each inner link is supported by a link assembly which can be made smaller in thickness than is conventionally possible. Thus, the total height $H_2$ of the base portions of each handling member is made advantageously small.

Thus, each processing chamber can be provided with a correspondingly small window for insertion of the handling members.

Further, the first to the third shafts 2–4 are coaxially arranged for rotation about a common vertical axis. Thus, the bearings supporting the first to the third shafts 2–4 and the magnetic fluid seals 5–7 can be made small in diameter. Therefore, the transfer robot as a whole is advantageously compact and inexpensive. Since the shafts for actuating the first and the second arm mechanisms are coaxially supported about the first axis $O_1$, the distance between the transfer robot and each processing chamber is equal.

Further, unlike the prior art robot, the driving devices 8–10 of the present invention are fixed to the stationary base member 1, and thus the power cable for supplying the driving devices with electricity does not break due to the rotation of the arm mechanisms. Such an arrangement makes it possible for the first and the second handling members 24, 44 to be rotated around the first axis $O_1$ through any desired angle. Thus, the robot of the present invention is more conveniently used than the prior art robot, so that productivity is improved. Further, the robot of the present invention is inexpensive since no additional devices for monitoring the rotation angle of the handling members are needed.

Further, it is possible to reduce the height $H_2$ for the base portions of the handling members 24, 44 by arranging the intermediate links of the respective pantograph assemblies in the same plane.

Figure 11:
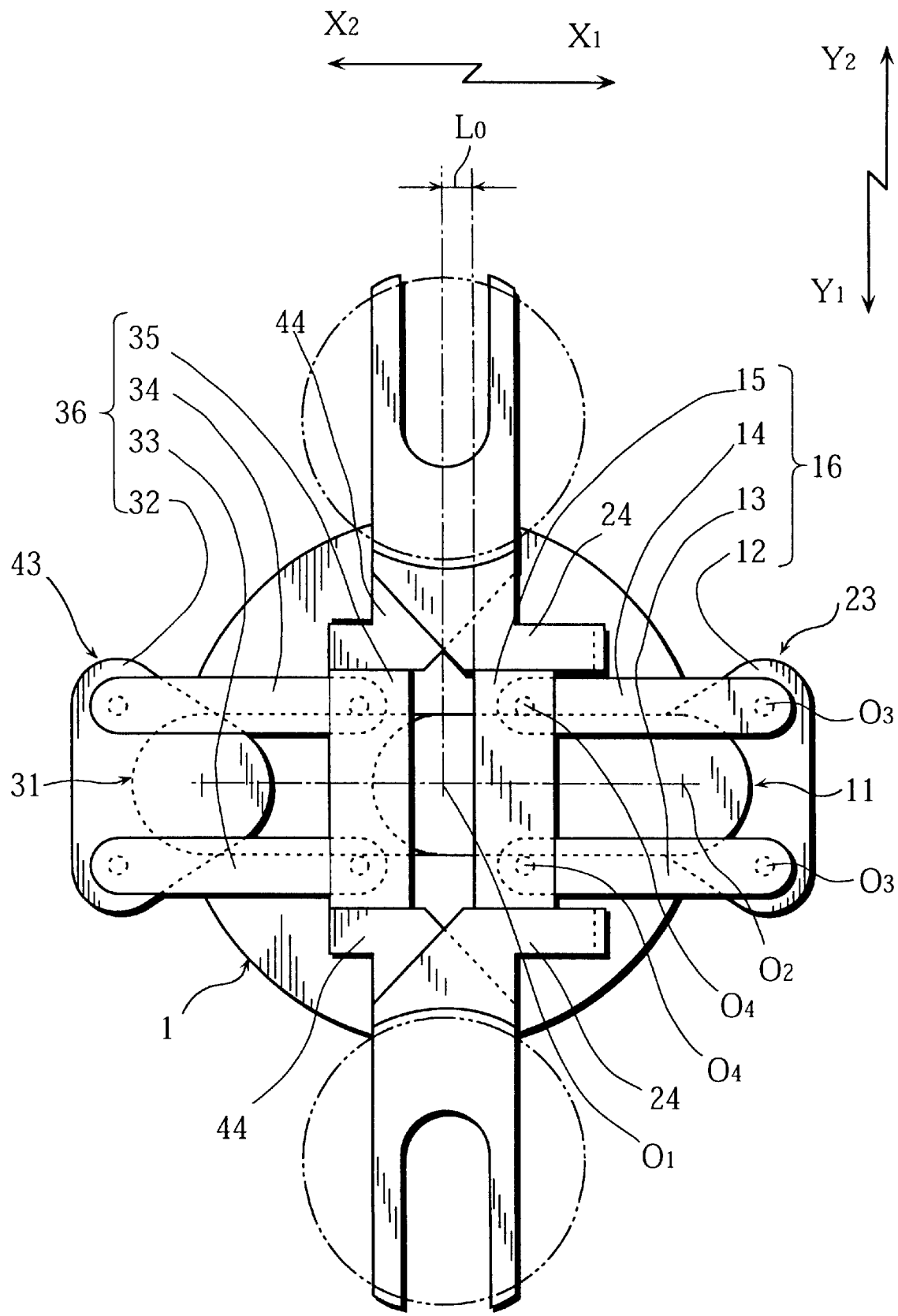
FIG. 11 is a plan view showing a second embodiment of the present invention.
Figure 12A:
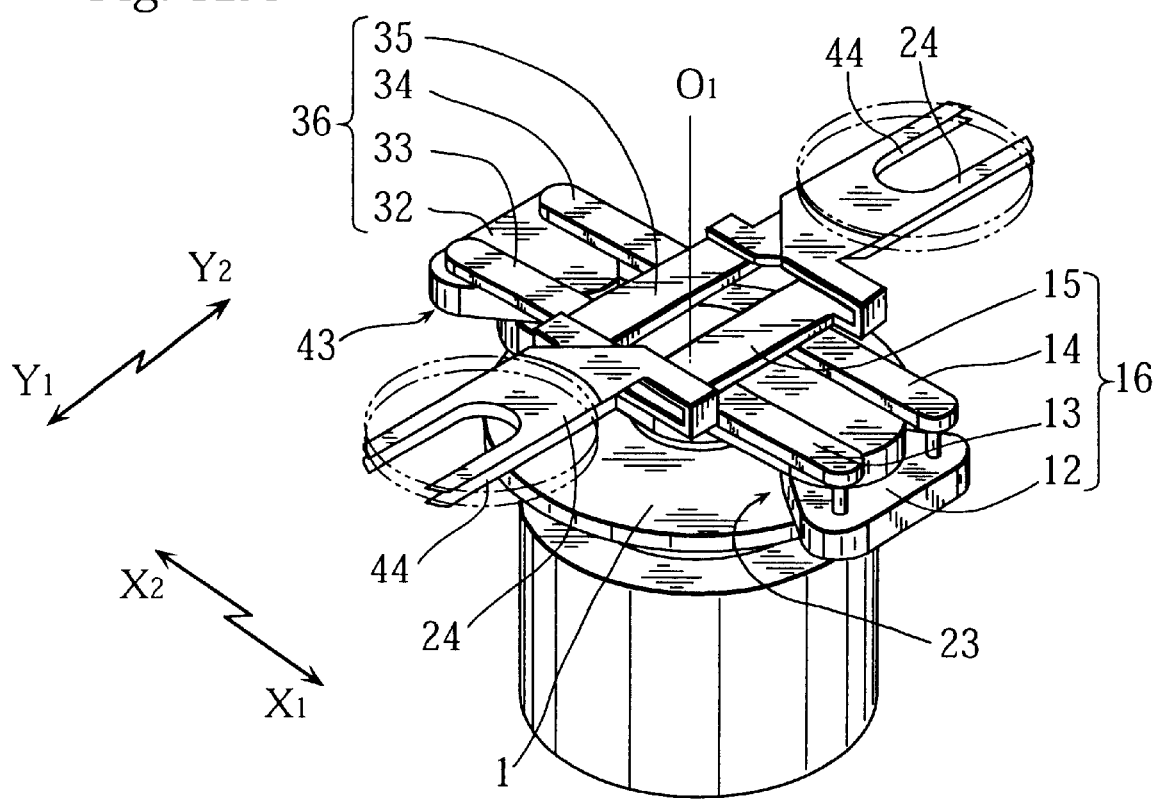
FIGS. 12A–12B are perspective views showing the robot of FIG. 11.
Figure 12B:
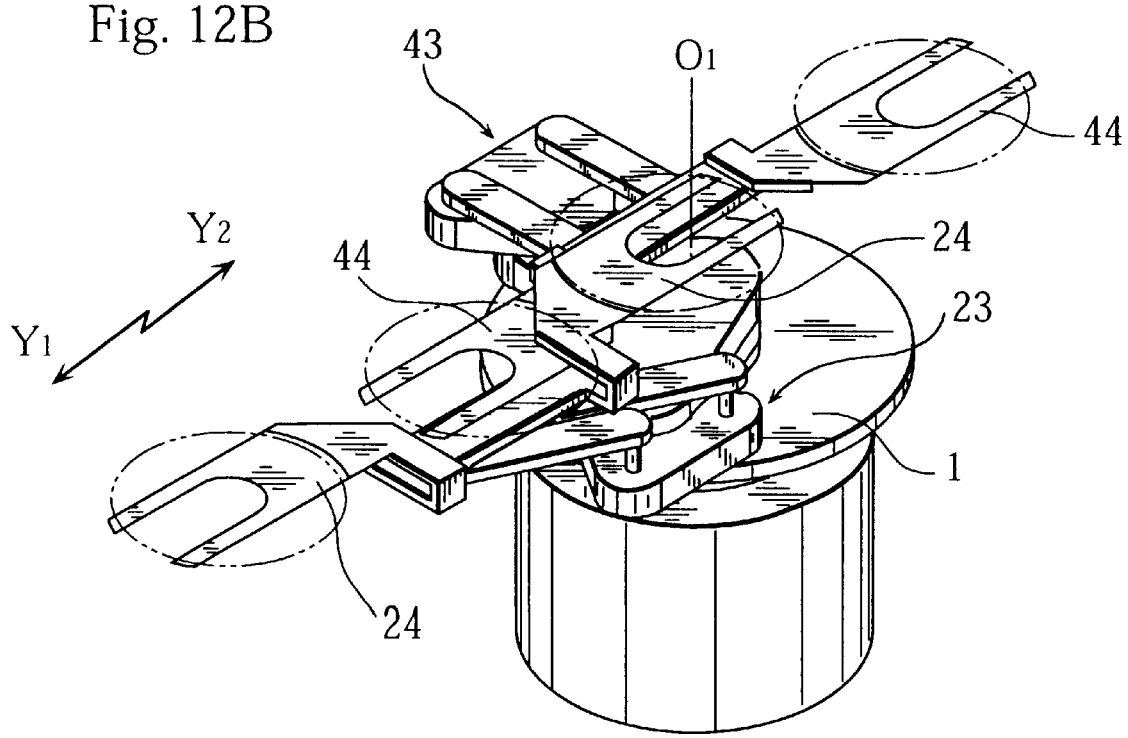

FIGS. 11 and 12 show a second embodiment of the present invention. According to this embodiment, each of the inner links 15, 35 is provided with two handling members horizontally projecting opposite to each other.

The two handling members of each arm mechanism are moved in the $Y_1$-$Y_2$ direction for example. Thus, four workpieces can be shifted onto or away from the respective handling members, while the robot is held at a single angular position about the first axis $O_1$. Typically, the two arm mechanisms will not be moved in the same direction simultaneously. However, it is possible to move the arm mechanisms in the opposite directions for handling two workpieces at the same time. In this way, the operation time of the robot is reduced, and therefore productivity is improved.

Figure 13:
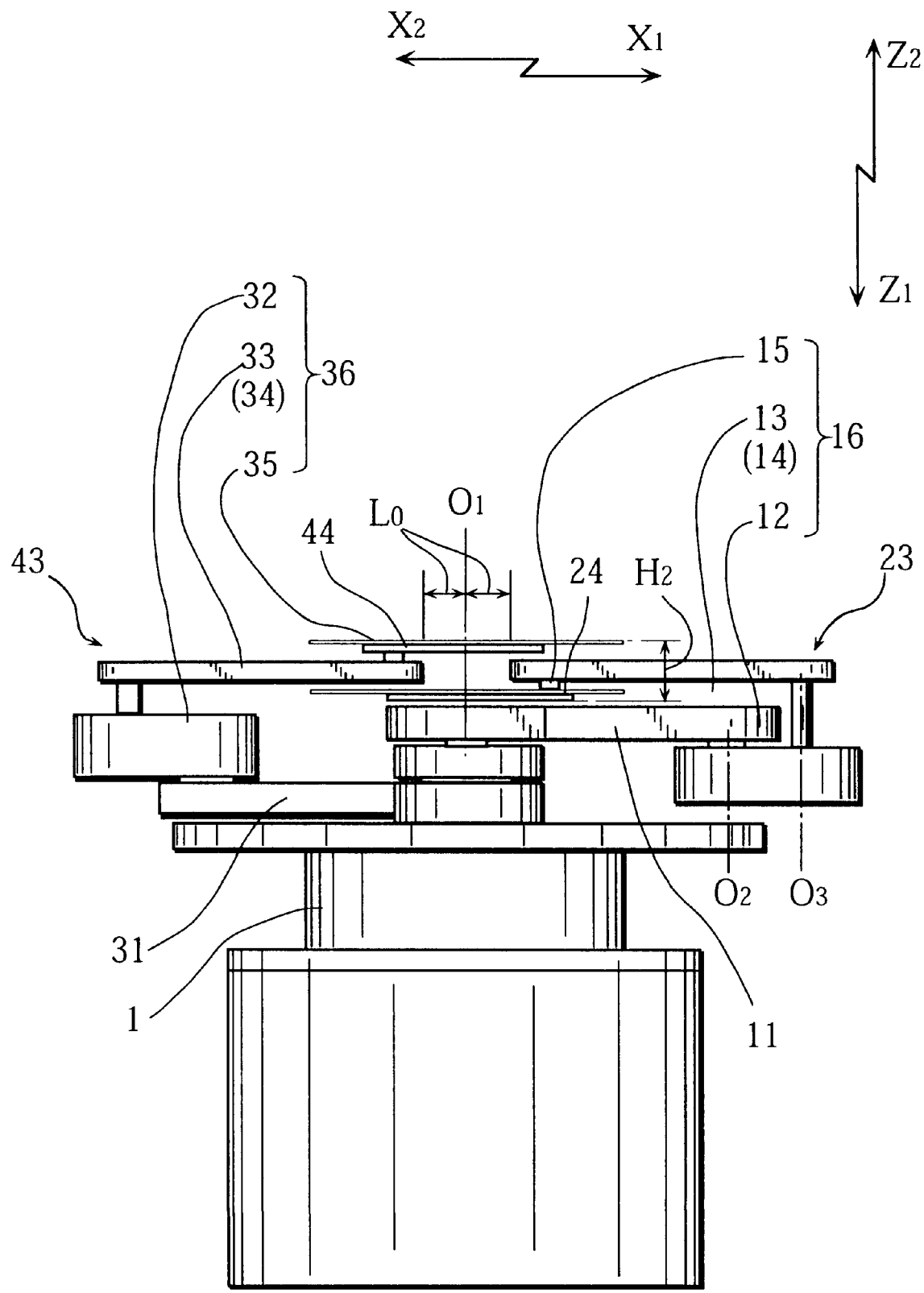
FIG. 13 is a front view showing a modified pantograph assembly.
Figure 14:
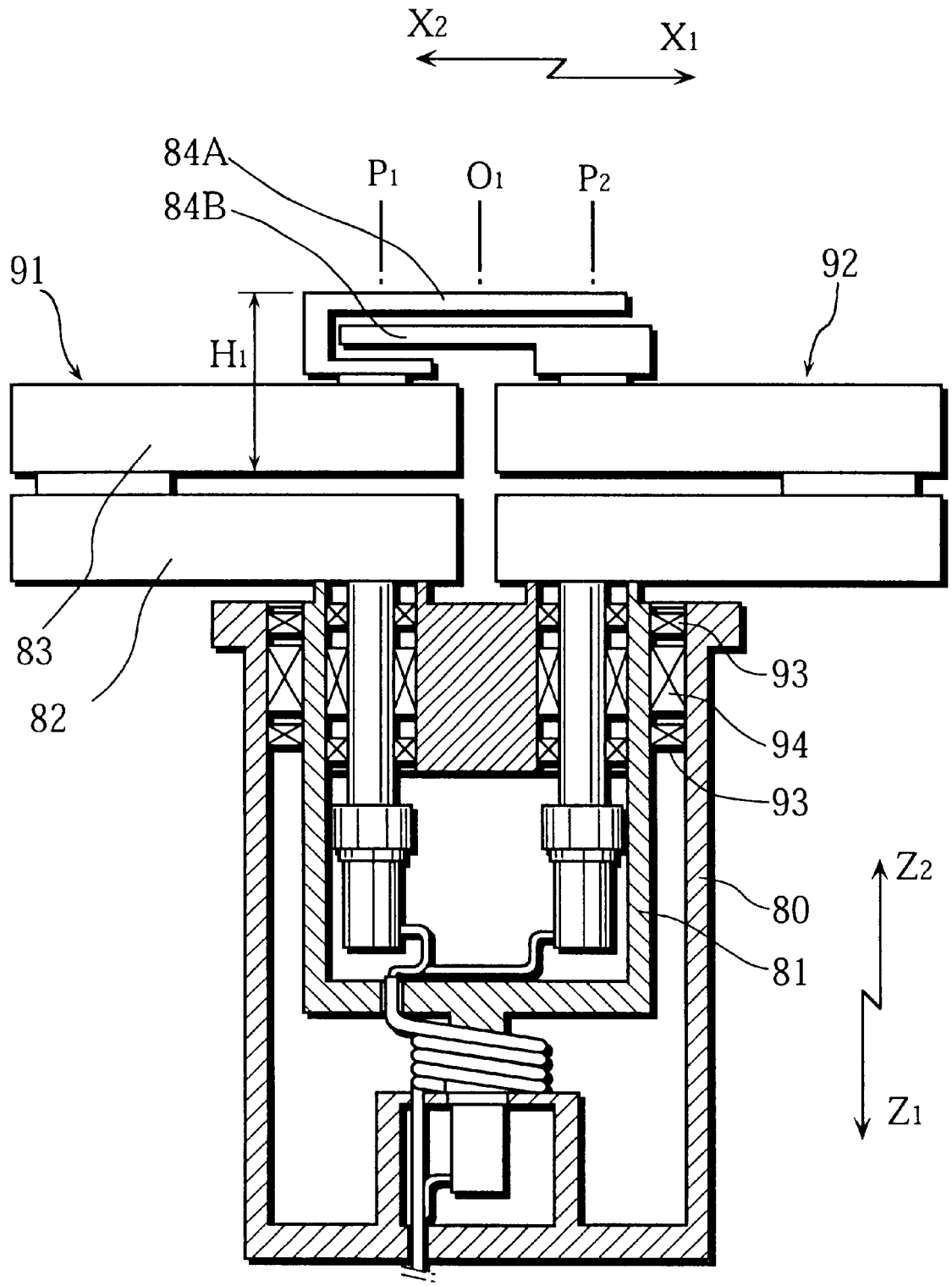
FIG. 14 is a front view showing a conventional transfer robot partially in section.
Figure 15:
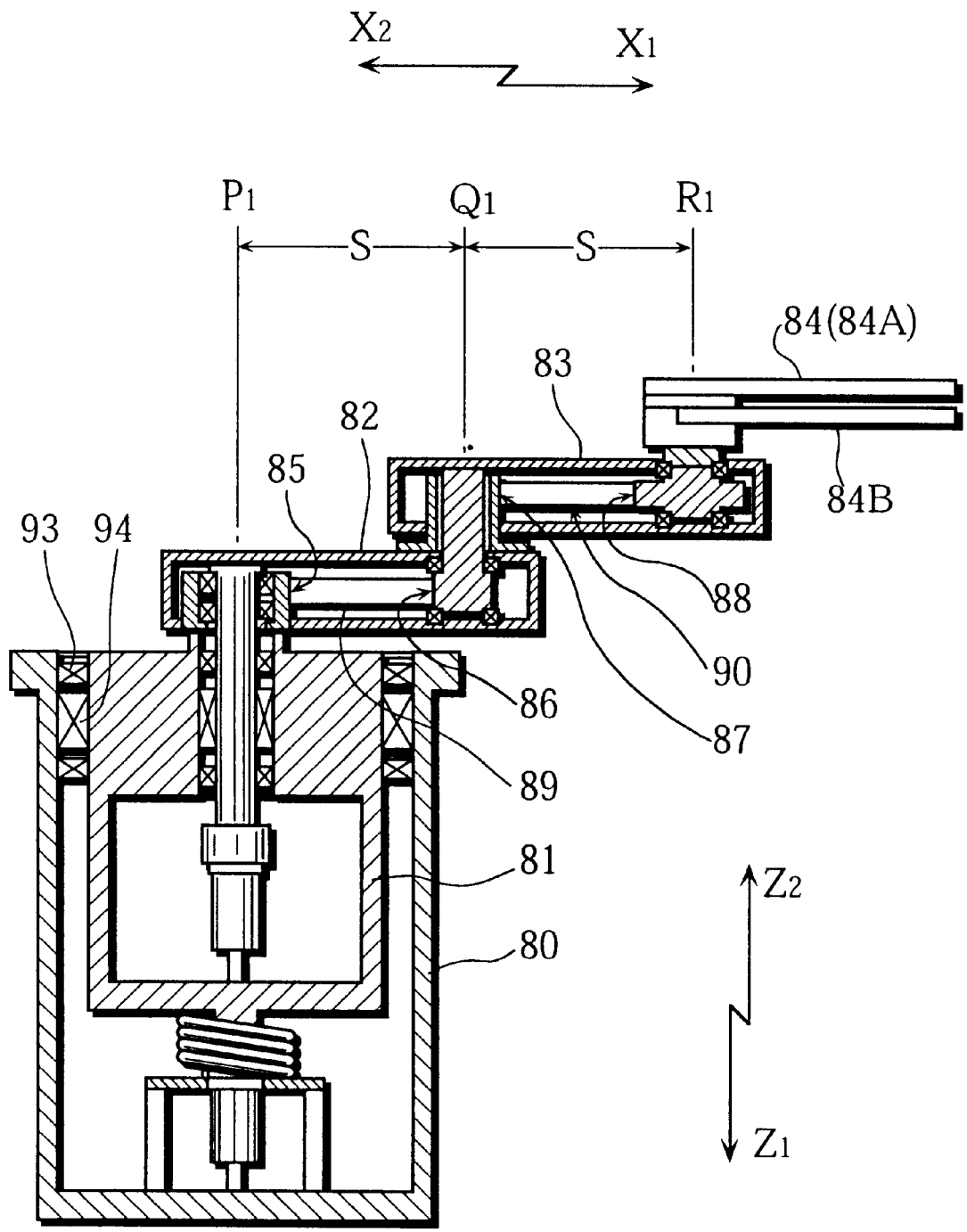
FIG. 15 is a sectional side view showing the transfer robot of FIG. 14.
Figure 16:
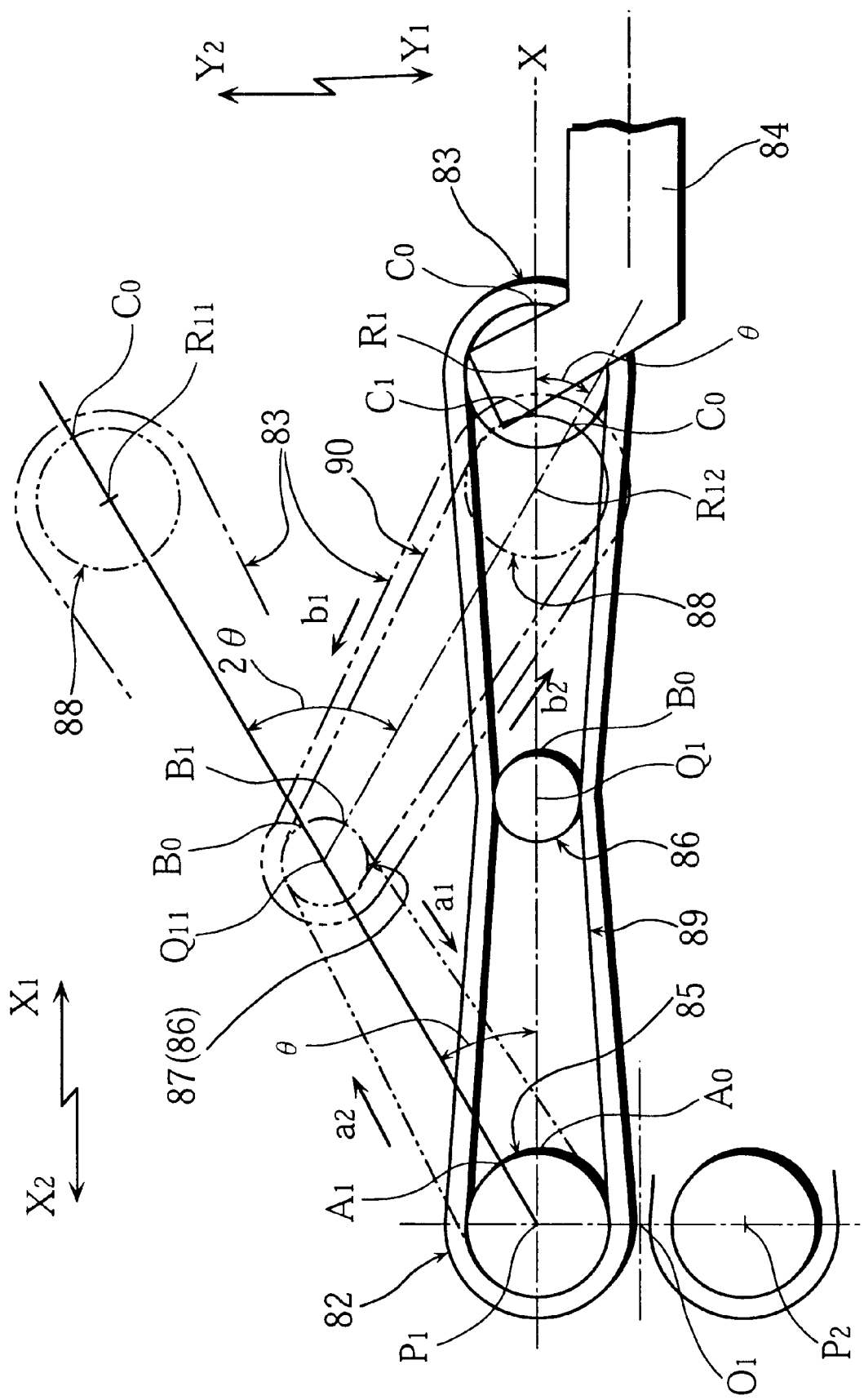
FIG. 16 is a plan view illustrating the operation of an arm mechanism of the conventional robot.
Figure 17:
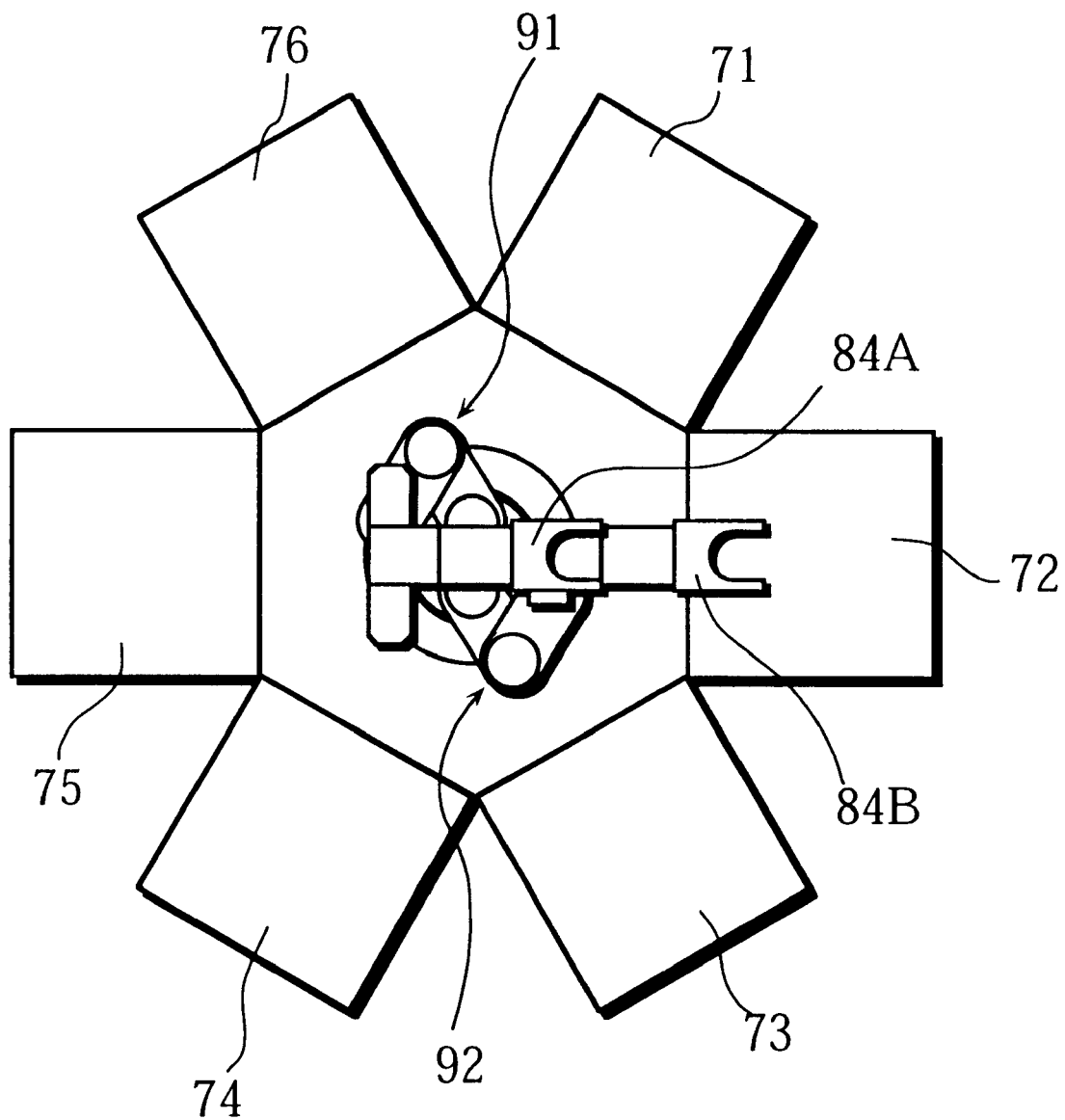
FIG. 17 is a plan view illustrating the conventional robot in operation.

FIG. 13 illustrates a modified pantograph assembly. In this assembly, the inner link 15 of the first arm mechanism 23 is attached to the lower surfaces of the respective intermediate links 13, 14, while the inner link 35 of the second arm mechanism 43 is attached to the upper surfaces of the respective intermediate links 33, 34. In this way, the height $H_2$ of the base portions of the handling members is minimized.

The preferred embodiments of the present invention being thus described, it is obvious that the same may be varied in many ways. Such variations are not to be regarded as a departure from the spirit and scope of the present invention, and all such modifications as would be obvious to those skilled in the art are intended to be included within the scope of the following claims.

We claim:

1. A two-armed transfer robot comprising:
   a first arm mechanism and a second arm mechanism, each arm mechanism being provided at an extremity thereof with a handling member for carrying a workpiece to be processed, the handling member arranged not only to linearly move in a horizontal plane but to rotate in the horizontal plane;
   a stationary base member;

first to third shafts rotatable about a first axis extending vertically, each shaft being coaxially supported by the base member; and first to third driving devices associated with the first to the third shafts, respectively, each driving device being attached to the base member;

wherein the first arm mechanism has a pantograph assembly including a first arm, an outer link, a pair of intermediate links and an inner link, the first arm being connected to the first shaft, the outer link being supported with respect to the first arm for pivotal movement about a second axis extending in parallel to the first axis, each intermediate link being supported with respect to the outer link for pivotal movement about a third axis, the third axes being spaced outward from the second axis, the second axis being located between the third axes as viewed circumferentially about the first axis, the inner link being supported with respect to each intermediate link for pivotal movement about a fourth axis located at a free end of said each intermediate link, a distance between the third axis and the fourth axis being equal to a distance between the first axis and the second axis, the first arm mechanism further having a first rotation-transmitting member fixed to the second shaft, a second rotation-transmitting member fixed to the outer link coaxially with the second axis, a third rotation-transmitting member fixed to the first arm coaxially with the second axis, a pair of fourth rotation-transmitting members each fixed to one of the intermediate links coaxially with the third axis, a first connecting member extending between the first and the second rotation-transmitting members, and a second connecting member extending between the third and the fourth rotation-transmitting members, the second arm mechanism being connected to the third shaft and substantially identical to the first arm mechanism, the first and the second arm mechanisms being symmetrical to each other with respect to the first axis, the first handling member being carried by the inner link of the first arm mechanism, the second handling member being carried by the inner link of the second arm mechanism, the first and the second handling members being vertically spaced from each other, the first and the second handling members being arranged not only to linearly move in horizontal straight lines passing through the first axis but to rotate simultaneously around the first axis.

2. The transfer robot according to claim 1, wherein the intermediate links of the pantograph assemblies of the respective arm mechanisms are arranged in a common plane.

3. The transfer robot according to claim 1, wherein the inner link of one arm mechanism is attached to an upper surface of each intermediate link of said one arm mechanism, while the inner link of the other arm mechanism is attached to a lower surface of each intermediate link of said other arm mechanism.

4. The transfer robot according to claim 1, wherein the first arm mechanism includes a third handling member attached to the inner link of the first arm mechanism, the third handling member projecting opposite to the first handling member, while the second arm mechanism includes a fourth handling member attached to the inner link of the second arm mechanism, the fourth handling member projecting opposite to the second handling member.

5. The transfer robot according to claim 1, wherein each of the first to the third shafts is rotatably supported via a magnetic fluid seal for hermetic sealing.

* * * * *